United States Patent
Olsson

(10) Patent No.: US 6,429,739 B1
(45) Date of Patent: Aug. 6, 2002

(54) AMPLIFIER WITH FEEDBACK POWER CONTROL LOOP OFFSET COMPENSATION

(75) Inventor: Torbjörn Olsson, Södra Sandby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 104 days.

(21) Appl. No.: 09/658,272

(22) Filed: Sep. 8, 2000

(30) Foreign Application Priority Data

Sep. 9, 1999 (GB) .............................................. 9921344

(51) Int. Cl.[7] .................................................. H03G 3/20
(52) U.S. Cl. ........................................ 330/129; 330/136
(58) Field of Search ........................ 330/85, 129, 136, 330/279, 280; 445/126

(56) References Cited

U.S. PATENT DOCUMENTS

| | | | |
|---|---|---|---|
| 5,304,947 A | 4/1994 | Carlsson | 330/279 |
| 5,812,025 A | * 9/1998 | Shimazaki | 330/279 X |
| 5,955,921 A | * 9/1999 | Ide et al. | 330/279 X |

FOREIGN PATENT DOCUMENTS

| | | |
|---|---|---|
| EP | 0 481 524 | 4/1992 |
| EP | 0 561 754 | 9/1993 |
| EP | 0 597 448 | 5/1994 |
| EP | 0 693 823 | 1/1996 |
| EP | 0 843 420 | 5/1998 |
| GB | 2301247 | 11/1996 |
| GB | 2330960 | 5/1999 |
| GB | 2354125 | * 3/2001 |
| WO | 98/44628 | 10/1998 |

* cited by examiner

Primary Examiner—Steven J. Mottola
(74) Attorney, Agent, or Firm—Burns, Doane, Swecker & Mathis, L.L.P.

(57) ABSTRACT

A power amplifier has a feedback loop to control the signal level thereof. A current sensing amplifier in the feedback loop is controlled to remove any offset. The input signal is compared with a reference level. When the input signal is below the reference level, an offset compensation value for the current sensing amplifier is stored. When the input signal is above the reference level, the previously stored offset compensation value continues to be applied. The circuit is of particular application in a TDMA radio transmitter.

8 Claims, 1 Drawing Sheet

filed in Great Britian on Sep. 9, 1999; the entire content of which is hereby incorporated by reference.

AMPLIFIER WITH FEEDBACK POWER CONTROL LOOP OFFSET COMPENSATION

This application claims priority under 35 U.S.C. §§119 and/or 365 to 9921344.9 filed in Great Britian on Sep. 9, 1999; the entire content of which is hereby incorporated by reference.

TECHNICAL FIELD OF THE INVENTION

This invention relates to an amplifer circuit, and in particular to an amplifier circuit for use in a radio transmitter, more specifically in a TDMA system.

BACKGROUND OF THE INVENTION

In many radio communications systems, it is necessary to be able to control accurately the power of an output signal which is to be transmitted.

Conventionally, this can be achieved by applying feedback control to the final power amplifier stage in the transmitter. For example, the current flowing in the power amplifier can be taken as a measure of the output power. This current can be detected by a current sensing amplifier, and the result compared with an input reference signal. Any error can then be supplied to a control input of the power amplifier to adjust the output thereof.

However, this conventional technique can only provide accurate control of the output power if the current sensing amplifier is accurate. If there is any offset in the current sensing amplifier, the output signal will not be controlled accurately.

U.S. Pat. No. 5,304,947 discloses a transmitter circuit for a TDMA system. A logic circuit is provided to determine a point at which the transmitter is between transmission time slots. At that point, application of a control signal provides that an offset cancellation value is updated, and applied during the subsequent transmission time slot. However, this requires an additional input to the transmitter circuit.

SUMMARY OF THE INVENTION

According to the present invention, any offset in a current sensing amplifier can be cancelled. In the case of a TDMA transmitter, an input signal will be zero at certain times, for example during time slots when the device is not transmitting. The circuit of the present invention detects time periods during which the input signal falls below a threshold level, and adjusts the current sensing amplifier to cancel any offset during such time periods.

This allows accurate measurement of currents in the power amplifier, and hence accurate control of transmitter powers.

Compared with an alternative in which an externally applied control signal is used to determine when offset cancellation should be applied, the present invention requires fewer input control signals, and hence fewer input pins for the circuit.

DETAILED DESCRIPTION OF PREFERRED EMBODIMENTS

Figure 1:
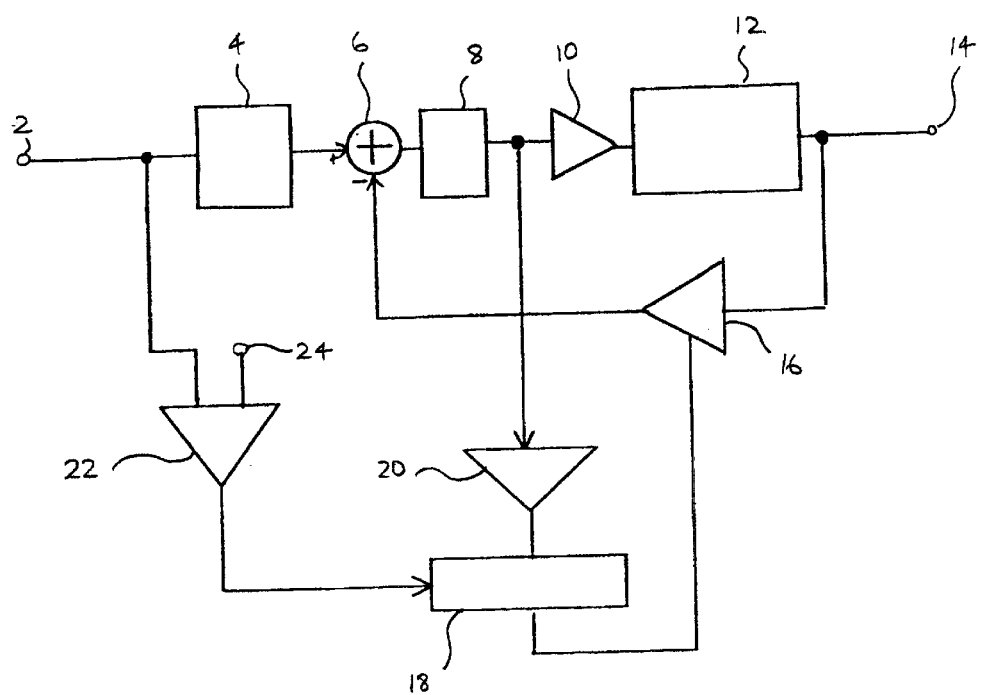
FIG. 1 is a block schematic diagram of an amplifier circuit in accordance with the invention.

FIG. 1 shows an amplifier circuit according to the invention. For example, the amplifier circuit may form part of a transmitter in a radio communications system, in particular a time division multiple access (TDMA) system. Advantageously, the amplifier circuit may be part of an integrated circuit.

An input signal is applied to an input terminal 2, and then to a smoothing filter 4, which slightly delays the input signal. The resulting signal is then applied to a feedback control loop, which includes an adder 6, which will be described in more detail later. The signal from the adder 6 is applied to an integrating loop filter 8, and then to a gain element and buffer 10, which presents the signal to a control input of a power amplifier 12. The signal from the power amplifier 12 is then suitable for transmission, for example via an antenna (not shown).

In order to control the power of transmitted signals, a negative feedback loop is provided. The current in the power amplifier 12 determines the transmitter power, and a current measurement amplifier 16 senses the output current from the power amplifier 12, and converts it into a form suitable for application to the inverting input of the adder 6.

Any error, detected by subtracting the current sensed by the amplifier 16 from the signal applied to the non-inverting input of the adder 6 from the filter 4, is amplified and filtered in the feedback loop in accordance with basic control theory, to bring the output signal to an amplified version of the input signal as desired.

However, in order for the feedback loop accurately to control the output, it is of course necessary for the current measurement amplifier 16 to provide an accurate measurement of the output current. If the measurement amplifier 16 suffers from offset, the output signal will not be accurate. Thus it is preferable to adjust the amplifier 16 to cancel any offset.

Cancellation of any offset is performed by an adjust/hold circuit 18, which receives inputs from a detector 20 and a comparator 22. When the comparator provides one input, a switch in the adjust/hold circuit 18 is closed, allowing a new value from the detector 20 to be applied to a capacitor (not shown) ("adjust mode"). When the comparator provides a different input, a switch in the adjust/hold circuit 18 is opened, preventing any new value from the detector 20 from being applied to the capacitor ("hold mode").

The comparator 22 receives one input from a reference input terminal 24, to which is applied a reference voltage VREF. For example, with input signals typically in the range from 0–3V, VREF might be set at 0.3V.

The comparator receives its other input from the input terminal 2. When the input signal level Vin is lower than the threshold VREF, that is, within the range $0 \leq Vin \leq VREF$, it is assumed that the input signal level is in fact zero, for example because it is during a time slot when the device is not transmitting. On the basis of that assumption, the comparator 22 provides an input which sends the adjust/hold circuit into the "adjust"mode, and any offset in the measurement amplifier 16 is cancelled.

The offset adjustment is carried out by detecting the output from the integrating filter 8, in the detector 20. If the measurement amplifier 16 is in balance, with no offset, then the output from the filter 8 will be a constant value. If there remains a positive offset, the output will raise, whereas, if there remains a negative offset, the output will fall. The detector 20 then supplies an input to the adjust/hold circuit 18, in order to produce an appropriate control of an adjustment signal applied to the measurement amplifier.

When the input signal level is higher than the threshold VREF, that is, $Vin \geq VREF$, the adjust/hold circuit goes into a "hold" mode, and any offset cancellation applied to the measurement amplifier 16 during the "adjust" mode is stored and continues to be applied.

As mentioned previously, the smoothing filter 4 applies a slight delay to the input signal. This has the effect that there is a delay before the input signal reaches the summing point 6. This is sufficient for the adjust/hold circuit to stabilise, so that the output power is controlled according to the system timing, and the signal is not disturbed during the burst.

It will be apparent that any input signal having a level below the threshold VREF will be treated as a zero input. In other words, the allowed input range is from VREF upwards. Thus, the smoothing filter 4 subtracts a voltage equivalent to VREF from the input, and thus also translates input signals such that an input signal at VREF is translated to zero, an input signal at (VREF+0.1V) is translated to 0.1V, etc. This also has to be compensated in software. VREF must first be added to input signals, so that subtracting VREF does not cause an error.

There is thus described an amplifier circuit with offset compensation, which allows such compensation in every signal cycle. Moreover, the control is carried out on the basis of the amplifier input signal, without requiring additional input signals or input pins.

What is claimed is:

1. An amplifier circuit, comprising:
   a signal input, for receiving an input signal;
   a power amplifier, for producing an output signal from said input signal;
   a feedback control circuit, for controlling a level of the output signal, the feedback control circuit including a sensor for sensing a current in the power amplifier; and
   a sensor compensation circuit,
   wherein the sensor compensation circuit adjusts and stores an offset compensation signal when the input signal is within a first range, and applies the stored offset compensation signal to the sensor when the input signal is within a second range.

2. An amplifier circuit as claimed in claim 1, including a reference voltage input, wherein the first range is below the reference voltage, and the second range is above the reference voltage.

3. An amplifier circuit as claimed in claim 1, wherein the feedback control circuit includes an adder, which receives the input signal and a feedback signal from the sensor, further comprising a delay circuit, for applying a delay to the input signal before the adder.

4. An amplifier circuit as claimed in claim 3, wherein the delay circuit is a low pass filter circuit.

5. A method of controlling an output power of an amplifier circuit, the method comprising:
   receiving an input signal;
   producing an output signal from said input signal by means of a power amplifier;
   controlling a level of the output signal by means of a feedback control circuit including a sensor for sensing a current in the power amplifier; and
   adjusting and storing an offset compensation signal when the input signal is within a first range, and applying the stored offset compensation signal to the sensor when the input signal is within a second range.

6. A method as claimed in claim 5, comprising applying a delay to the input signal before applying the input signal to the feedback control circuit.

7. An amplifier circuit, for use in a TDMA transmitter, the circuit comprising:
   an input terminal;
   a power amplifier;
   an output terminal;
   a feedback circuit, for producing a feedback signal from an output signal, for comparison with an input signal, the feedback circuit including an adjustable offset compensator;
   a comparator, for comparing the input signal level with a reference signal level range; and
   a switching circuit, for permitting adjustment of the offset compensator only when the input signal level is within the reference signal level range.

8. An amplifier circuit as claimed in claim 7, wherein the switching circuit permits adjustment of the offset compensator only when the input signal level is below a threshold value.

* * * * *